(12) United States Patent
Chinnaswamy et al.

(10) Patent No.: US 10,134,471 B2
(45) Date of Patent: Nov. 20, 2018

(54) HYBRID MEMORY ARCHITECTURES

(71) Applicants: Kumar K. Chinnaswamy, Portland, OR (US); Randy B. Osborne, Beaverton, OR (US); Erik W. Peter, Hillsboro, OR (US)

(72) Inventors: Kumar K. Chinnaswamy, Portland, OR (US); Randy B. Osborne, Beaverton, OR (US); Erik W. Peter, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/539,866

(22) Filed: Nov. 12, 2014

(65) Prior Publication Data

US 2015/0143034 A1 May 21, 2015

Related U.S. Application Data

(63) Continuation of application No. 12/646,719, filed on Dec. 23, 2009, now Pat. No. 8,914,568.

(51) Int. Cl.
| | |
|---|---|
| *G06F 12/08* | (2016.01) |
| *G11C 14/00* | (2006.01) |
| *G06F 12/0866* | (2016.01) |
| *G11C 7/10* | (2006.01) |
| *G06F 3/06* | (2006.01) |

(52) U.S. Cl.
CPC ......... *G11C 14/0045* (2013.01); *G06F 12/08* (2013.01); *G06F 12/0866* (2013.01); *G11C 7/1072* (2013.01); *G11C 14/0027* (2013.01); *G06F 3/068* (2013.01); *G06F 3/0685* (2013.01); *G06F 2212/205* (2013.01)

(58) Field of Classification Search
CPC . G11C 11/005; G11C 7/1022; G11C 14/0027; G11C 14/0045; G06F 12/023; G06F 12/0638; G06F 3/068; G06F 3/0685; G06F 12/0866; G06F 12/08
USPC .................................................. 711/103, 102
See application file for complete search history.

(56) References Cited

U.S. PATENT DOCUMENTS

| | | | |
|---|---|---|---|
| 5,875,451 A | 2/1999 | Joseph | |
| 7,095,642 B1* | 8/2006 | Parent et al. | ................... 365/51 |
| 7,096,378 B2 | 8/2006 | Stence et al. | |
| 7,127,563 B2* | 10/2006 | Rader | ................. G06F 13/1684 711/148 |
| 7,827,348 B2 | 11/2010 | Lee et al. | |
| 8,225,069 B2* | 7/2012 | Fang | .................. G06F 12/0292 711/202 |

(Continued)

FOREIGN PATENT DOCUMENTS

| | | |
|---|---|---|
| CN | 1650259 | 8/2005 |
| WO | WO-2008057557 | 5/2008 |
| WO | WO-2008086488 | 7/2008 |

OTHER PUBLICATIONS

Dhiman, G. et al., "PDRAM: A Hybrid PRAM and DRAM Main Memory System," DAC '09, Jul. 26-31, 2009, pp. 1-6.*

(Continued)

*Primary Examiner* — Pierre Miche Bataille
(74) *Attorney, Agent, or Firm* — Compass IP Law PC

(57) ABSTRACT

Methods and apparatuses for providing a hybrid memory module having both volatile and non-volatile memories to replace a DDR channel in a processing system.

8 Claims, 4 Drawing Sheets

(56) References Cited

U.S. PATENT DOCUMENTS

| | | | | |
|---|---|---|---|---|
| 8,296,496 | B2* | 10/2012 | Mogul | G06F 12/023 |
| | | | | 711/102 |
| 8,397,013 | B1* | 3/2013 | Rosenband | G06F 13/385 |
| | | | | 711/103 |
| 8,427,891 | B2* | 4/2013 | Best | G06F 12/0638 |
| | | | | 365/185.08 |
| 8,429,332 | B2* | 4/2013 | Chen | G06F 11/1048 |
| | | | | 711/103 |
| 8,452,912 | B2* | 5/2013 | Lee | G06F 12/0246 |
| | | | | 710/54 |
| 2002/0172074 | A1* | 11/2002 | Hsu | G11C 11/005 |
| | | | | 365/185.08 |
| 2005/0251617 | A1* | 11/2005 | Sinclair | G06F 3/061 |
| | | | | 711/103 |
| 2006/0004949 | A1 | 1/2006 | Steenwijk et al. | |
| 2007/0276996 | A1 | 11/2007 | Caulkins et al. | |
| 2008/0082751 | A1 | 4/2008 | Okin et al. | |
| 2008/0155183 | A1 | 6/2008 | Zhuang et al. | |
| 2008/0162822 | A1 | 7/2008 | Okuyama et al. | |
| 2008/0235468 | A1* | 9/2008 | Chen | G06F 12/0246 |
| | | | | 711/154 |
| 2009/0248959 | A1 | 10/2009 | Tzeng | |
| 2009/0254705 | A1 | 10/2009 | Abali et al. | |
| 2009/0313416 | A1* | 12/2009 | Nation | 711/100 |
| 2010/0082892 | A1 | 4/2010 | Ma et al. | |
| 2010/0115204 | A1 | 5/2010 | Li et al. | |
| 2010/0191911 | A1* | 7/2010 | Heddes | G06F 15/16 |
| | | | | 711/118 |
| 2011/0093654 | A1* | 4/2011 | Roberts | G06F 1/3203 |
| | | | | 711/105 |

OTHER PUBLICATIONS

Hyunsun Park, "Power Management of Hybrid DRAM/PRAM-Based Main Memory", ACM Jun. 2011, pp. 59-64.*
Lee et al, "Architecting Phase Change Memory as a Scalable DRAM Alternative", Microsoft Research, Computer Computer Architecture Group, Jun. 2009.*
Int'l Search Report and Written Opinion for Int'l Patent Application No. PCT/US10/058246 dated Aug. 29, 2011, 8 pgs.
Supplementary European Search Report for European Application No. 10843433.3 dated Aug. 5, 2013, 7 pages.
Final Office Action for U.S. Appl. No. 12/646,719 dated Feb. 25, 2014, 12 pages.
Final Office Action for U.S. Appl. No. 12/646,719 dated Jul. 16, 2012, 11 pages.
Office Action for U.S. Appl. No. 12/646,719, dated Feb. 14, 2012, 9 pages.
Office Action for U.S. Appl. No. 12/646,719, dated Sep. 4, 2013, 11 pages.
First Office Action & Search Report for Chinese Patent Application No. 201080059364.7 dated Mar. 19, 2014, 19 pages.
Notice of Allowance for U.S. Appl. No. 12/646,719, dated Aug. 14, 2014, 12 pages.
Second Office Action in related Chinese Application No. 201080059364.7, dated Oct. 16, 2014, 21 pages including English Translation.

* cited by examiner

HYBRID MEMORY ARCHITECTURES

CLAIM OF PRIORITY

This United States continuation patent application is related to, and claims priority to, U.S. patent application Ser. No. 12/646,719 entitled "HYBRID MEMORY ARCHITECTURES," filed Dec. 23, 2009, the entire contents of which are incorporated herein by reference.

TECHNICAL FIELD

Embodiments of the invention relate to memory systems in electronic devices. More particularly, embodiments of the invention relate to hybrid memory architectures that may be utilized in electronic devices.

BACKGROUND

FIG. 1 is a block diagram of a current processing system having dual data rate (DDR) memory modules and non-volatile memory. Example computer system 100 includes one or more processor cores 110 that are coupled to memory. Processor core(s) 110 may be coupled to multiple dual-inline memory modules (DIMMs) 130 via DDR channels 120. Computer system 100 includes two DDR channels, but additional links may also be included.

Processor core(s) 110 may also be coupled to non-volatile memory 160 via link 150. The non-volatile memory may include, for example, flash memory (NAND or NOR), phase change memory, etc. In these systems memory bandwidth is dependent on DDR technology scaling and the number of DDR channels in the system.

Beyond certain frequencies, scaling of DDR channels becomes increasingly expensive and complex. Thus, increasing memory bandwidth my adding DDR channels and/or increasing channel frequency can drastically increase the cost of the system.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Figure 1:
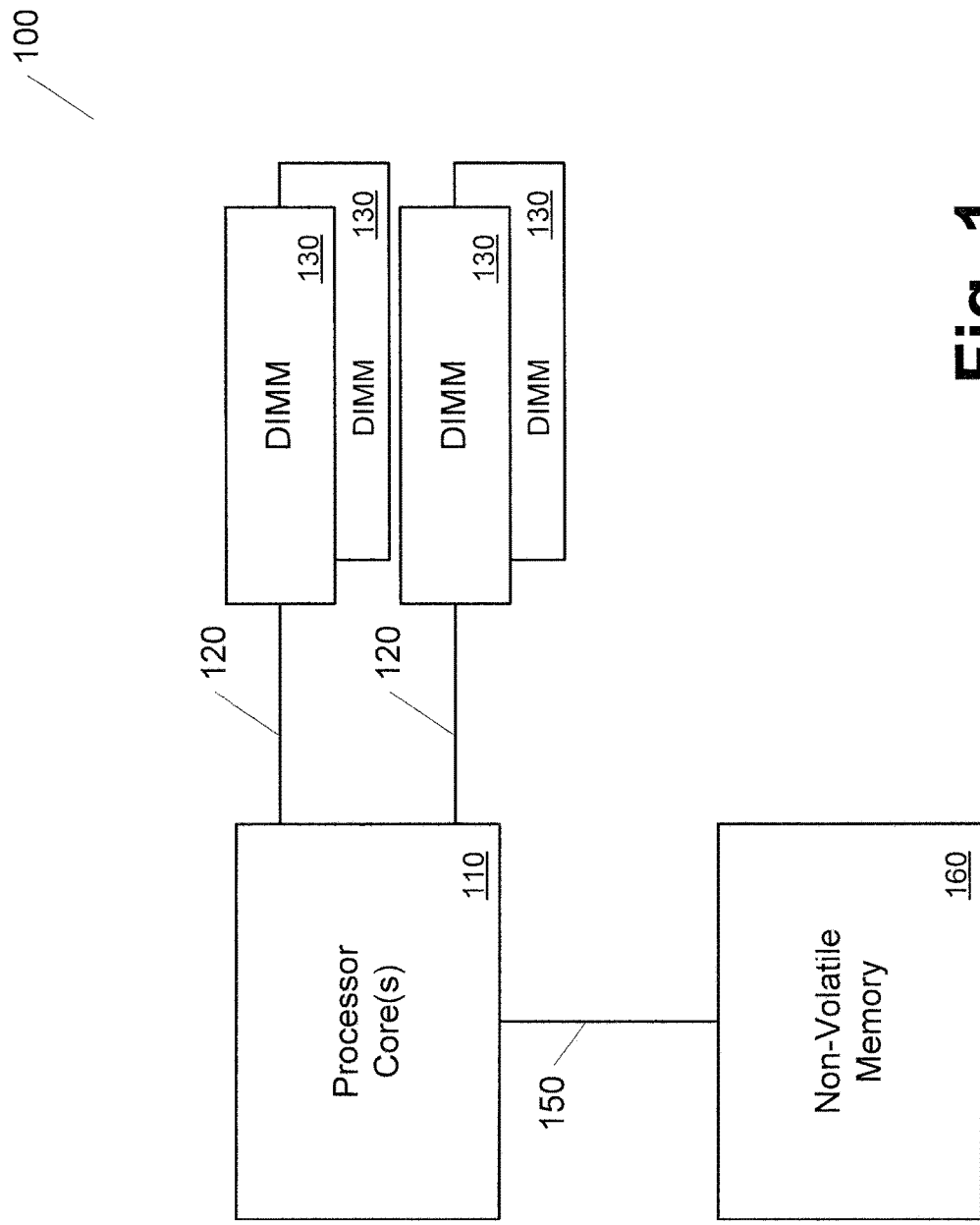
FIG. 1 is a block diagram of a current processing system having dual data rate (DDR) memory modules and non-volatile memory.
Figure 2:
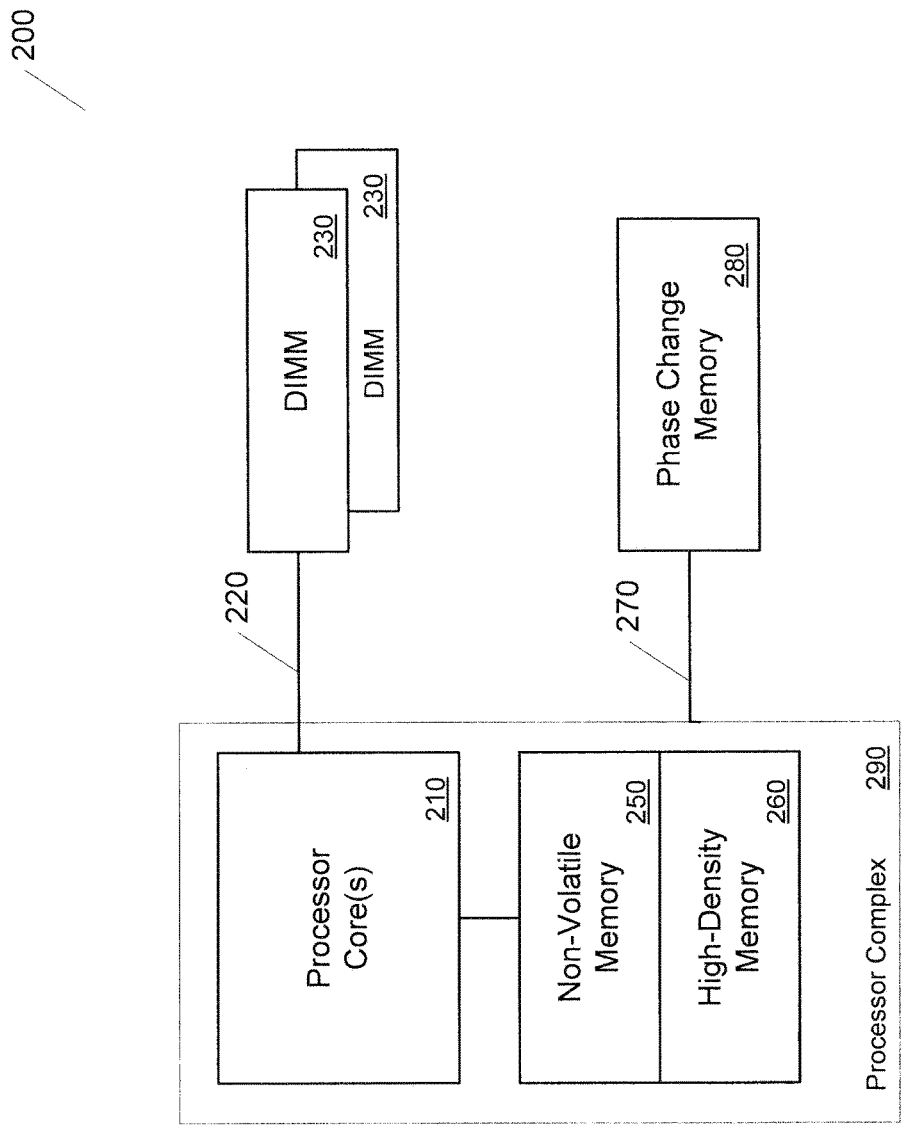
FIG. 2 is a block diagram of one embodiment of a processing system having a hybrid memory module.

FIG. 2 is a block diagram of one embodiment of a processing system having a hybrid memory module. The example embodiment of FIG. 2 is processing system 200 that includes processor core(s) 210. Processing system 200 may be any type of processing system, for example, a laptop computer system, a desktop computer system, a server, etc.

Processing system 200 includes processor complex 290, which further includes processor core(s) 210. Processor core(s) 210 may include any number of processor cores in any configuration known in the art. In one embodiment, processor complex 290 includes multiple components within a single integrated circuit package. In alternate embodiments, multiple integrated circuit packages may be used.

Processor core(s) 210 are coupled with DIMMs 230 via DDR channel 220. In one embodiment, processing system 200 includes only a single DDR channel. In alternate embodiments, multiple DDR channels may be supported. As described in greater detail below, at least one DDR channel may be replaced by a hybrid memory structure that is included in processor complex 290.

In one embodiment, processor complex 290 includes a hybrid memory module coupled with processor core(s) 210. The hybrid memory module partially or completely offsets the memory capacity and memory bandwidth lost by absence of the deleted DDR channel. In one embodiment, the bandwidth loss is offset by use of high density memory (HDM) 260 compatible with logic process (e.g. embedded DRAM, Resistive-RAM, Thyristor-RAM, Ferroelectric-RAM) that is included in processor complex 290 and coupled with processor core(s) 210. In one embodiment, flash memory (e.g., NAND memory) 250 is included in the hybrid memory module to function as a disk cache to offset loss of the DIMMs from the lost DDR channel. In an alternate embodiment, the hybrid memory module may include standard DRAM and NAND flash memory. Other combinations can also be supported.

In some applications, the combination of one DDR channel with the hybrid memory module may provide better performance than a two DDR channel system. In one embodiment, HDM 260 is an eDRAM last level hardware managed cache memory with misses serviced by the DDR memory. In other embodiments HDM is resistive-RAM, Thyristor-RAM, or Ferroelectric-RAM). Flash memory 250 may act as a disk cache and buffer against slow hard disk accesses.

In one embodiment, processor complex 290 may be coupled with an external memory other than through the DDR channel. For example, processor complex 290 may be coupled with phase change memory (PCM) 280 via memory link 270.

Figure 3:
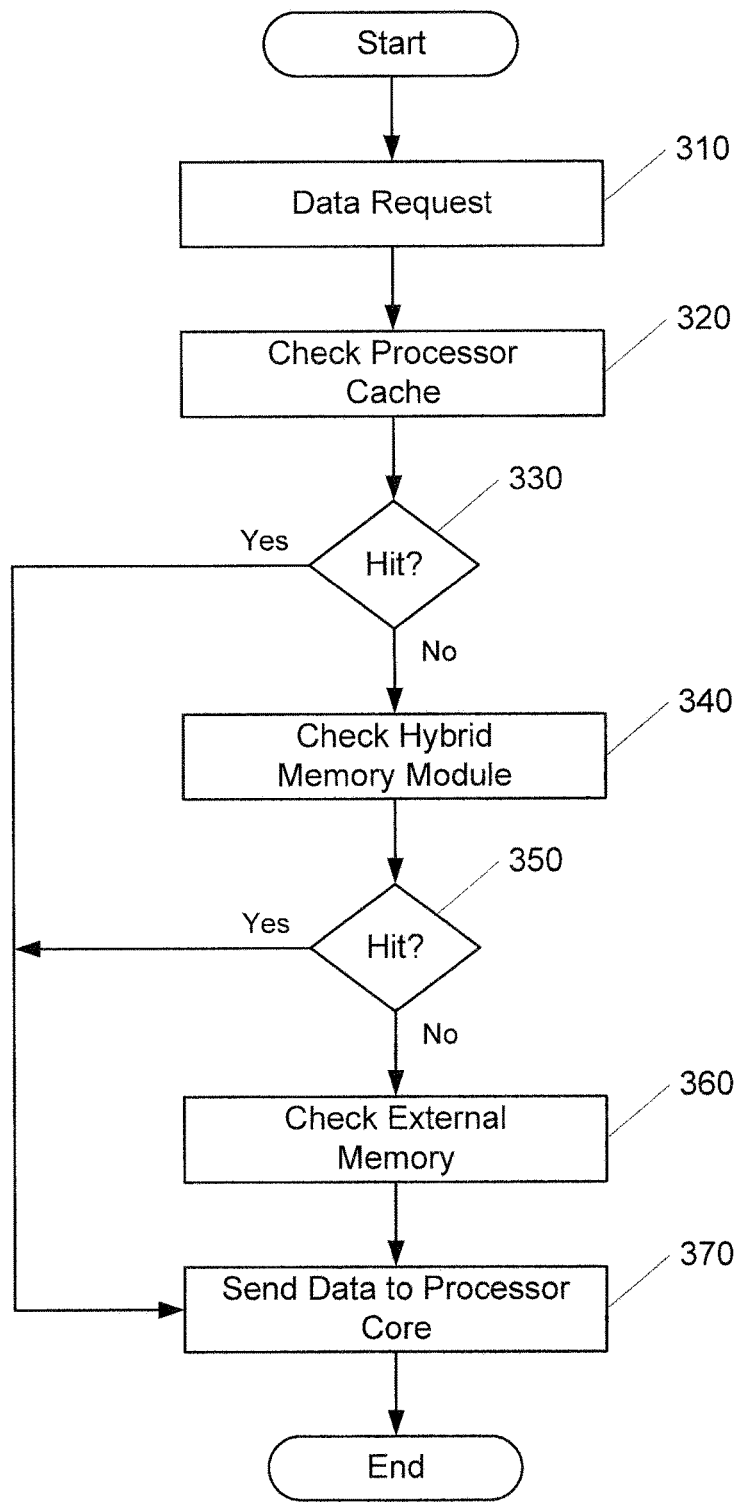
FIG. 3 is a flow diagram of one embodiment of a technique for retrieving requested data from memory in a system having a hybrid memory module.

FIG. 3 is a flow diagram of one embodiment of a technique for retrieving requested data from memory in a system having a hybrid memory module. During the course of execution of instructions a processor core will be required to retrieve data from some memory storage element. The processor core may include one or more levels of cache memory. Use of cache multiple levels of cache memory in a processor core is known, and any appropriate cache memory structure may be utilized.

A memory request is generated by the processor core, 310. In response to the memory request the processor core may search one or more levels of cache memory, 320. If the requested data is found in the cache memory included in the processor core, a cache hit condition exists, 330, and the requested data is used by the processor core, 370.

If the data is not found in the cache memory included in the processor core, a cache miss condition exists, 330, and the hybrid memory module is searched for the requested data, 340. In one embodiment, the hybrid memory module is included in a processor complex, but is not included in the processor core. In another embodiment, the hybrid memory module may be external to the processor core and a processor complex, or there may be no processor complex and the hybrid memory module may be external to the processor core package.

In one embodiment, the hybrid memory module functions as a last-level hardware managed cache with misses serviced by external memory, for example, the DDR system memory. In one embodiment, the last-level hardware cache functionality is provided by eDRAM in the hybrid memory module. If the requested data is found in the hybrid memory module, a cache hit condition exists, 350, and the requested data is used by the processor core, 370. In other embodiments the last-level hard cache functionality is provided by resistive-RAM, Thyristor-RAM, or Ferroelectric-RAM.

If the data is not found in the hybrid memory module, a cache miss condition exists, 350, and the external memory is searched for the requested data, 360. In one embodiment, the external memory includes at least the DDR system memory (e.g., DIMMs 230 in FIG. 2). In one embodiment, the external memory may also include phase change memory (PCM), for example, PCM 280 in FIG. 2. In one embodiment, the hybrid memory module and/or PCM can operate as a disk cache to provide buffering against a slower hard disk drive or other mass storage device.

The hybrid memory module architecture described herein may be particularly beneficial for certain types of computing tasks. For example, in gaming or graphical design workloads, the bandwidth provided by the HDM is generally greater than the bandwidth provided by a two-channel DDR system memory, which provides improved performance for graphical tasks.

Figure 4:
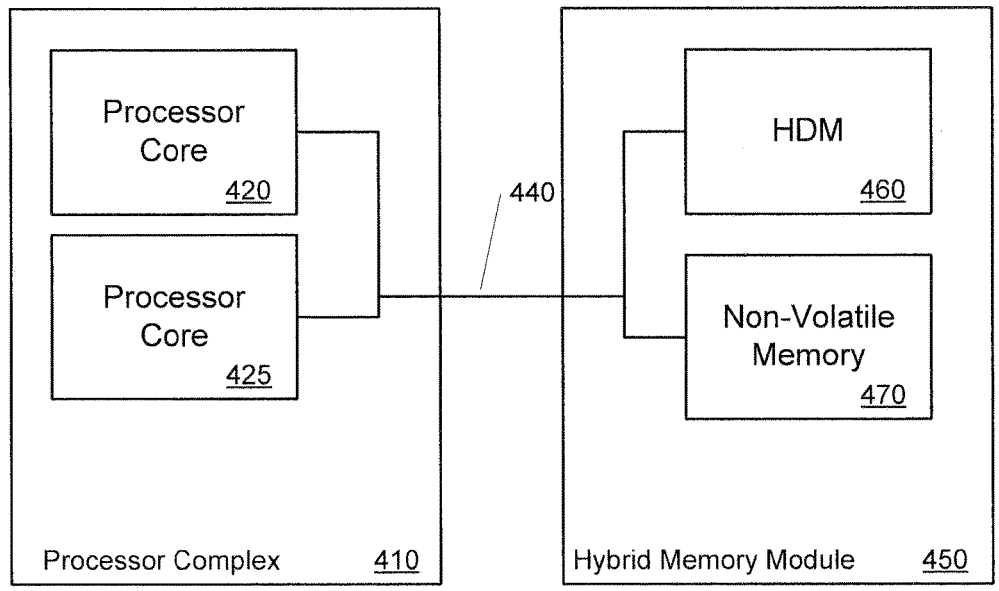
FIG. 4 is a block diagram of one embodiment of a user-upgradable memory module that may allow modification of a system with a hybrid memory module architecture.

FIG. 4 is a block diagram of one embodiment of a user-upgradable memory module that may allow modification of a system with a hybrid memory module architecture. By varying the HDM and non-volatile memory sizes, platform performance segmentation can be created. In one embodiment, a NAND controller is part of the module and can use processor core processing power and memory for NAND management.

Processor complex 410 can include any number of processor cores (e.g., 420, 425). FIG. 4 provides an example illustration with two processor cores for reasons of simplicity of description only. Any number may be supported. Processor complex 410 may be coupled with hybrid memory module 450 via interconnect 440. Interconnect may be a rigid or a flexible connection mechanism that may allow a user to connect and disconnect hybrid memory module 450.

Hybrid memory module 450 includes HDM 460 and non-volatile memory 470. In one embodiment, hybrid memory module 450 includes a fixed amount of eDRAM and non-volatile memory, for example, in a single package. In an alternate embodiment, eDRAM 460 and/or non-volatile memory 470 may be user removable and upgradable. In other embodiments the HDM is resistive-RAM, Thyristor-RAM, or Ferroelectric-RAM.

Figure 5:
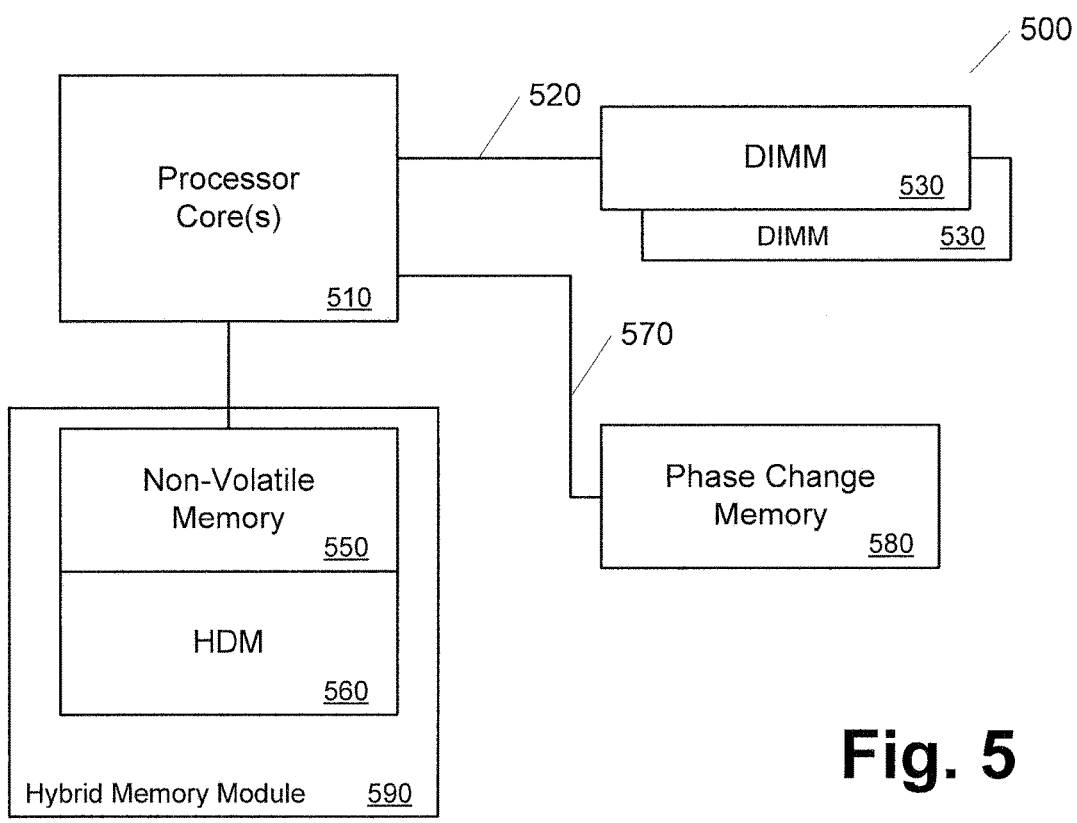
FIG. 5 is a block diagram of one embodiment of a processing system having a user-upgradable hybrid memory module.

FIG. 5 is a block diagram of one embodiment of a processing system having a user-upgradable hybrid memory module. The example embodiment of FIG. 5 is processing system 500 that includes processor core(s) 510. Processing system 500 may be any type of processing system, for example, a laptop computer system, a desktop computer system, a server, etc.

Processor core(s) 510 may include any number of processor cores in any configuration known in the art. In one embodiment, processor core(s) 510 may be multiple components within a single integrated circuit package. In alternate embodiments, multiple integrated circuit packages may be used.

Processor core(s) 510 are coupled with DIMMs 530 via DDR channel 520. In one embodiment, processing system 500 includes only a single DDR channel. In alternate embodiments, multiple DDR channels may be supported. As described in greater detail below, at least one DDR channel may be replaced by a hybrid memory 590. In the example of FIG. 5, processor core(s) 510 may be coupled with hybrid memory 590 via an interconnect as described above with respect to FIG. 4.

In one embodiment, hybrid memory module 590 is coupled with processor core(s) 510. Hybrid memory module 590 partially or completely offsets the memory capacity and memory bandwidth lost by absence of the deleted DDR channel. In one embodiment, the bandwidth loss is offset by use of high density memory (HDM) 560 compatible with logic process (e.g. embedded DRAM, Resistive-RAM, Thyristor-RAM, Ferroelectric-RAM) coupled with processor core(s) 510. In one embodiment, flash memory (e.g., NAND memory) 550 is included in the hybrid memory module to function as a disk cache to offset loss of the DIMMs from the lost DDR channel. In an alternate embodiment, the hybrid memory module may include standard DRAM and NAND flash memory. Other combinations can also be supported.

In some applications, the combination of one DDR channel with the hybrid memory module may provide better performance than a two DDR channel system. In one embodiment, HDM 560 is an eDRAM last level hardware managed cache memory with misses serviced by the DDR memory. In other embodiments HDM is resistive-RAM, Thyristor-RAM, or Ferroelectric-RAM). Flash memory 550 may act as a disk cache and buffer against slow hard disk accesses.

In one embodiment, processor core(s) 510 may be coupled with an external memory other than through the DDR channel. For example, processor core(s) 510 may be coupled with phase change memory (PCM) 580 via memory link 570.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus, comprising:
   a hybrid system memory implementation within an integrated circuit package, a plurality of processor cores also within said integrated circuit package, said hybrid system memory implementation composed of DRAM memory and non flash, non volatile memory, said plurality of processor cores to execute program code instructions including instructions that make requests for data that resides within the hybrid system memory;

a dual data rate (DDR) memory channel interface, said plurality of processor cores to execute program code instructions including instructions that make requests for data that resides within memory that is coupled to the dual data rate memory channel; and, a plurality of caches that reside above said hybrid system memory and said memory in a data accessing hierarchy of said apparatus such that said plurality of caches are searched for data requested by said program code instructions before said data is accessed from said hybrid system memory or said memory.

2. The apparatus of claim 1 further comprising a controller coupled to said non flash, non volatile memory.

3. The apparatus of claim 1 wherein at least a portion of said hybrid system memory implementation is to operate as a cache.

4. The apparatus of claim 3 wherein said cache is architecturally located between said plurality of processing cores and one or more system memory storage units.

5. The apparatus of claim 1 wherein said non flash, non volatile memory is implemented with resistive RAM.

6. The apparatus of claim 1 wherein said non flash, non volatile memory is implemented with thyristor RAM.

7. The apparatus of claim 1 wherein said non flash, non volatile memory is are implemented with ferroelectric RAM.

8. The apparatus of claim 1 wherein
the DRAM memory comprises embedded DRAM memory.

* * * * *